United States Patent [19]

Ishihara

[11] Patent Number: 4,667,092
[45] Date of Patent: May 19, 1987

[54] SOLID-STATE IMAGE DEVICE WITH RESIN LENS AND RESIN CONTACT LAYER

[75] Inventor: Yasuo Ishihara, Tokyo, Japan

[73] Assignee: NEC Corporation, Japan

[21] Appl. No.: 564,403

[22] Filed: Dec. 22, 1983

[30] Foreign Application Priority Data

Dec. 28, 1982 [JP] Japan ................................ 57-229039
Aug. 12, 1983 [JP] Japan ................................ 58-147534

[51] Int. Cl.$^4$ .................................................. H01J 3/14
[52] U.S. Cl. ...................................... 250/216; 250/578
[58] Field of Search ................... 250/211 R, 216, 239, 250/578; 357/24 LR, 30, 31, 32; 358/212, 213; 350/416, 433, 441

[56] References Cited

U.S. PATENT DOCUMENTS

| | | | |
|---|---|---|---|
| 4,024,397 | 5/1977 | Weiner ................................ | 250/216 |
| 4,395,629 | 7/1983 | Sasano et al. ........................ | 250/578 |
| 4,410,804 | 10/1983 | Stauffer ................................ | 250/578 |
| 4,467,195 | 8/1984 | Kawamura et al. ................. | 250/578 |
| 4,523,102 | 6/1985 | Kazufumi et al. ................... | 250/578 |
| 4,528,446 | 7/1985 | Dunaway et al. ................... | 250/578 |

*Primary Examiner*—David C. Nelms
*Attorney, Agent, or Firm*—Laff, Whitesel, Conte & Saret

[57] ABSTRACT

In a solid-state image device comprising an image storage block having a block surface, a plurality of storage elements are embeded along the block surface to store an image in the form of electric charge. An overlying layer is deposited to form an array of optical lenses in correspondence to the storage elements. An intermediate layer is laid between the block surface and the overlying layer. Incident light focuses through the lenses and the intermediate layer onto the storage elements. The intermediate layer serves as an adjusting layer for adjusting a focal length.

17 Claims, 14 Drawing Figures

SOLID-STATE IMAGE DEVICE WITH RESIN LENS AND RESIN CONTACT LAYER

BACKGROUND OF THE INVENTION

This invention relates to a solid-state image device and a method of manufacturing the same.

Recently, an inexpensive and small-size television camera has been required with a popularization of a video tape recorder. It has been a recent trend that a solid-state image device is used in such a television camera in lieu of a usual image pickup tube. A conventional solid-state image device comprises a semiconductor substrate as an image storage block in which a plurality of storage elements are formed for storage of an image in the form of electric charge. A total area of the storage elements serves as a photoelectric transducer area, which is intervened by a signal readout area. This makes it impossible to use the whole area of the semiconductor substrate as the photoelectric transducer area. Thus, the conventional solid-state image device can not effectively utilize all rays incident thereon and therefore has a low photosensitivity.

A color solid-state image device has been proposed which comprises a color filter film having a plurality of color filters on a top surface. The color filter film comprises a plurality of individual color filters for different colors. The color filters must be in register with the respective storage elements. The register is, however, difficult. As a result, the color filters are somewhat displaced relative to the respective storage elements. Such displacement gives rise to a variation of colors in each storage element.

SUMMARY OF THE INVENTION

It is therefore a general object of this invention to provide a solid-state image device which is capable of effectively utilizing all rays incident thereon and has a high photosensitivity.

It is a specific object of this invention to provide a color solid-state image device which can avoid a variation of colors even when displacement takes place between color filters and storage elements.

It is a further object of this invention to provide a method which is capable of readily manufacturing a solid-state image device of the type described.

According to this invention, there is provided a solid-state image device comprising an image storage block which has a block surface and comprises a plurality of storage elements for storing an image in the form of electric charge, a resin layer on the block surface, and an array of optical lenses overlying the resin layer in correspondence to the storage elements.

It is preferred that the resin layer comprises a first film of a first resin operable as a color filter for the image and attached to said block surface in correspondence to the storage elements and a second film of a second resin between the first film and said array of optical lenses.

DESCRIPTION OF THE PREFERRED EMBODIMENTS

Figure 1:
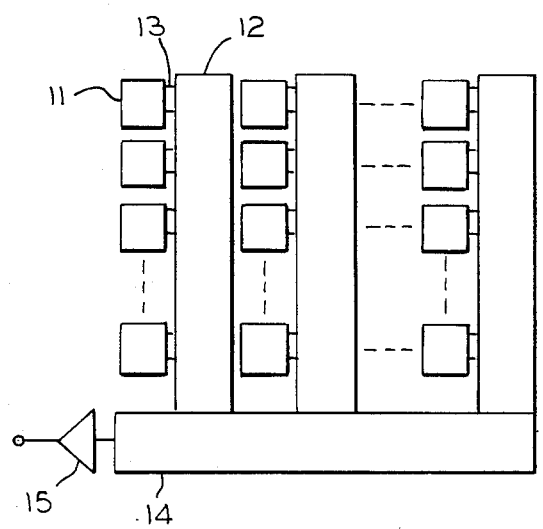
FIG. 1 is a schematic plan view of a conventional interline transfer CCD solid-state image device.
Figure 2:
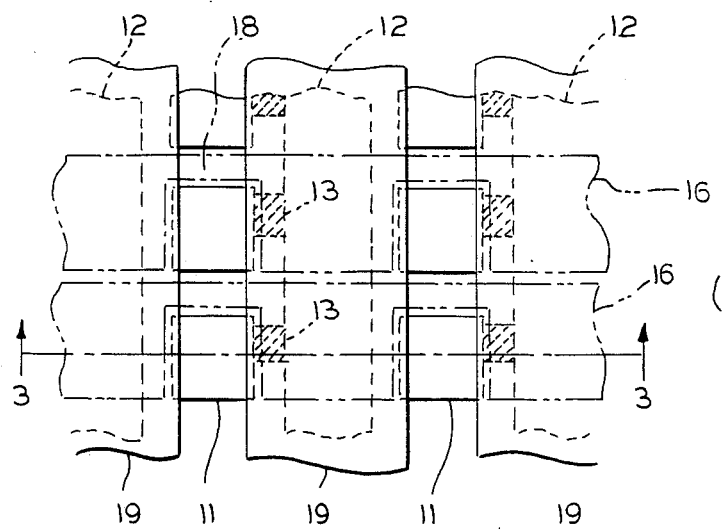
FIG. 2 is an enlarged fragmentary top view of the interline transfer CCD solid-state image device depicted in FIG. 1.
Figure 3:
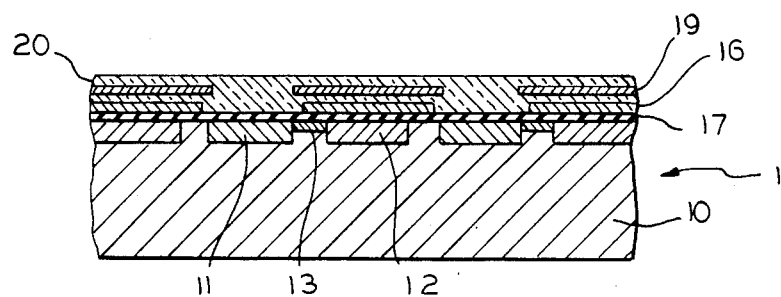
FIG. 3 is a vertical sectional view taken along a line 3—3 in FIG. 2.

Referring to FIGS. 1 through 3, description will be made of a conventional interline transfer CCD solid-state image device in order to facilitate an understanding of this invention. The device has a semiconductor substrate 10 (FIG. 3). A plurality of photoelectric transducers 11, such as photodiodes (hereinafter referred to as photodiodes 11), are formed in the semiconductor substrate 10. The photodiodes 11 are arranged in rows and columns as best shown in FIG. 1. The photodiodes 11 are for storing an image in the form of electric charge. A column CCD register 12 is arranged in the vicinity of each column of the photodiodes 11. The CCD register 12 is for reading the electric charge out of the respective photodiodes 11 as a column signal in the manner known in the art. For the purpose of read out, a transfer gate 13 is laid between each photodiode 11 and the CCD register 12 so as to transfer the electric charge from each photodiode 11 to the adjacent CCD register 12. A single row CCD register 14 is laid transversely of the column registers 12 and connected to one end of each column CCD register 12. The row CCD register 14 is for collecting the column signals of the respective column CCD registers 12, column by column, into a row signal. The row CCD register 14 delivers the row signal to an amplifier 15 which produces a device output signal.

Referring more particularly to FIGS. 2 and 3, a transparent insulative layer 17 is laid on the semiconductor substrate 10. A transfer electrode 16 is deposited on the insulative layer 17 along each row of the photodiodes 11. The transfer electrode 16 is electrically coupled to the column CCD registers 12 through the insulative layer 17. A narrow or channel portion 18 of the transfer electrode 16 runs between two adjacent photodiodes 11 of each column. The column CCD registers 12 and the transfer gates 13 are covered with a shading layer 19 to be shaded from incident rays or light. The shading layer 19 may be an opaque aluminum film and is buried in a phosphor-glass layer 20 brought into contact with the transfer electrode 16 and the insulative layer 17. The shading layer 19 serves to direct the incident rays only towards the photodiodes 11. The above-mentioned structure will be called a block having a block surface directed upwards of FIG. 3.

Referring to FIGS. 4(a) through 4(d), a solid-state image device and a method of manufacturing the same according to a first embodiment of this invention will be described in regard to an interline transfer CCD solid-state image device, which comprises similar parts designated by like reference numerals.

Figure 4A:
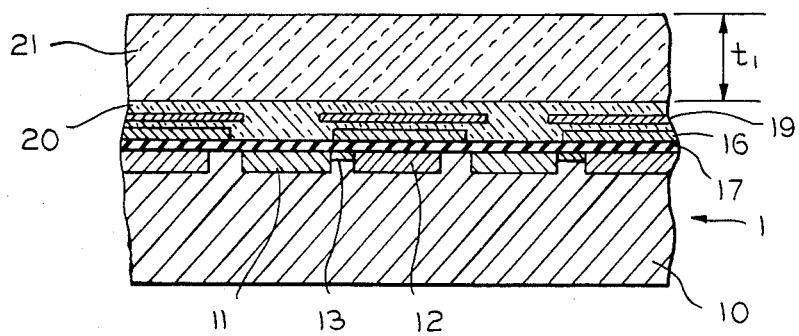
FIGS. 4(a), 4(b), 4(c) and 4(d) are diagrammatic vertical sectional views illustrating several steps of a method of manufacturing for fabricating an interline transfer CCD solid-state image device according to a first embodiment of this invention.

As depicted in FIG. 4(a), a first photosensitive transparent resin layer 21 which has a predetermined glass transition temperature is spin-coated on the block surface of the block depicted at 1 in FIG. 4(a). Such a glass transition temperature may be a softening temperature. For convenience of description, the predetermined glass transition temperature will be called a first softening temperature hereinafter. Preferably, the first resin layer 21 is of a phenol-novolac resin. The first resin layer 21 has a function of reducing an unevenness of the block surface of the block 1 and another function of controlling a focal length of an optical lens to be formed later so that the incident rays focus on the photodiode 11. Therefore, a thickness $t_1$ of the first resin layer 21 is adjusted to an optimum value. The first resin layer 21 is selectively removed by the use of a lithography technique at portions which lie on bonding pad and scribe line areas (not shown) of the block surface of the block 1. Far-ultraviolet rays may be used in the lithography technique. Thereafter, the first resin layer 21 is subjected to a first heat treatment at a first temperature which is not lower than the first softening temperature of the first resin layer 21. During the first heat treatment, the first resin layer 21 is softened and flattened at the top surface thereof. The heat-treated resin layer 21 increases an adhesion strength between the first resin layer 21 and the block 1. In this event, the first resin layer 21 is thermally cured due to formation of cross-linking. Therefore, the heat-treated resin layer 21 has a second softening temperature higher than the first softening temperature which the first resin layer 21 has before the first heat treatment.

Figure 4B:
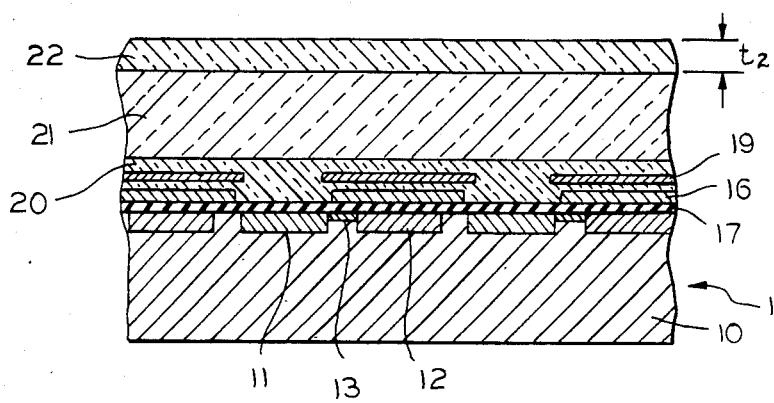

As depicted in FIG. 4(b), a second photosensitive transparent resin layer 22 is applied onto the heat-treated resin layer 21. The second resin layer 22 may be of a photosensitive transparent resinous material common to the first resin layer 21. The second resin layer 22 is selectively removed by the use of the far-ultraviolet lithography technique at portions lying on the shading layers 19. The second resin layer 22 is adjusted to have a thickness $t_2$ which satisfies equations to be described later.

Figure 4C:
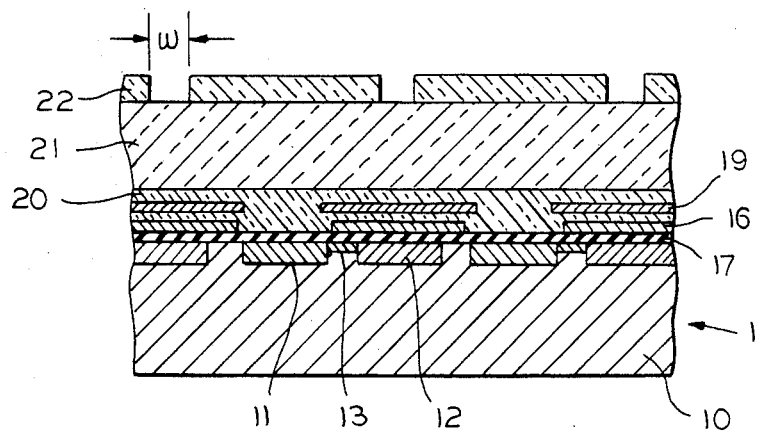

As depicted in FIG. 4(c), the second resin layer 22 is divided by the selective removal into a plurality of stripes which overlie the respective columns of the photodiodes 11. The stripes are spaced apart by a spacing w which will not make the thickness $t_2$ change during a lens formation process which follows.

The second resin layer 22 is subsequently subjected to a second heat treatment at a second temperature which is higher than the first softening temperature and lower than the second softening temperature. The second temperature may be equal to the first temperature. During the second heat treatment, each stripe thermally flows to slightly extend along the top surface of the first resin layer 21 and becomes round at the edge. The first resin layer or the heat-treated resin layer 21 is not subjected to any deformation.

Figure 4D:
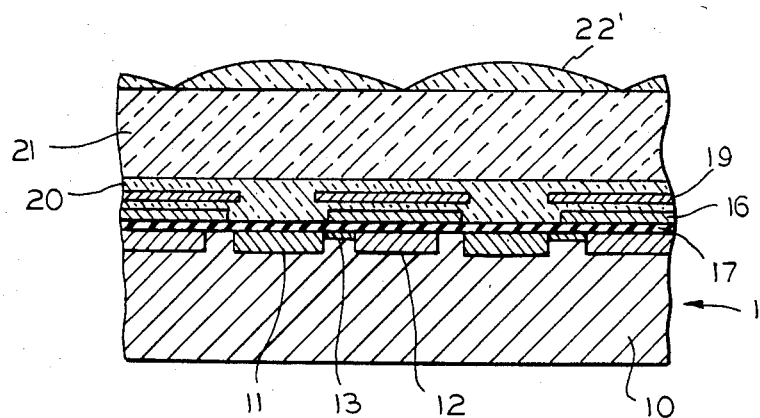

As depicted in FIG. 4(d), the stripes are transformed by the thermal flow into a series of cylindrical optical lenses 22' over the respective columns of the photodiodes 11. In this manner, an array of optical lenses is formed on the block surface.

It is to be noted here that the cylindrical lenses 22' are substantially continuous on the heat-treated resin layer 21. More specifically, each cylindrical lens 22' has lens edges on the heat-treated resin layer 21. It is preferred that two adjacent ones of the clindrical lenses 22' share a lens edge in common. It is possible with this to make the photodiodes 11 receive substantially all rays which are incident towards the block surface.

Figure 5:
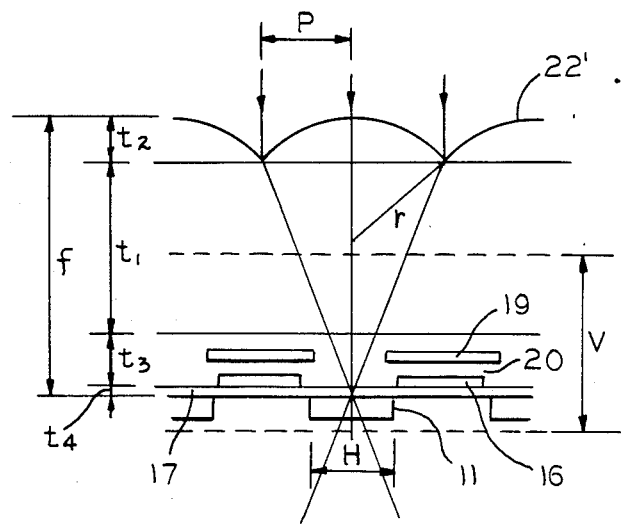
FIG. 5 is an enlarged vertical sectional view of a pair of the solid-state image device depicted in FIG. 4(d)

Referring to FIG. 5, each optical lens 22' will be described more in detail. For simplicity of analysis, it will be assumed that an incident ray is normal to the surface of the first resin layer 21 and that the lens 22' is a thin lens and focuses the incident ray on the center of the surface of the photodiode 11. Moreover, it will be assumed that the phosphor-glass resin layer 20 and the insulative layer 17 have thickness $t_3$ and $t_4$, respectively, and that the first resin layer 21 and the optical lens 22' are of a common resinous material and have a common index of refraction. As obvious from the figure, the optical lens 22' gives rise to refraction. The phosphor-glass layer 20 and the first resin layer 21 are operable as the optical path for the incident rays, which focus on the photodiode 11.

Focal length f is given by the following equation:

$$f = n_1 \cdot r/(n_1 - n_0), \tag{1}$$

where r is the curvature of the optical lens 22', $n_0$ and $n_1$ are indices of refraction of the air and the optical lens 22', respectively.

The thickness $t_1$ of the first resin layer 21 for the correct focus can be obtained from the following equations:

$$r^2 = p^2 + (r - t_2)^2, \tag{2}$$

where p is a half of the pitch of the photodiode 11, and $$t_1 = f - (t_2 + t_3 + t_4). \tag{3}$$

Using equations (1), (2), and (3), the thickness $t_1$ is given by:

$$t_1 = n_1 \cdot (P^2 + t_2)/(n_1 - n_0) \cdot 2t_2 - (t_2 + t_3 + t_4). \tag{4}$$

In connection with the above, it is to be noted here that the thickness $t_1$ of the first resin layer 21 has a wide margin V in sufficiently collecting the rays. The margin V is dependent on a ratio of the total area of each photodiode 11 to the whole area of each element. This ratio may be referred to as an aperture ratio.

It is desirable that the lens axis of each cylindrical lens 22' passes through the center of the associated column of the photodiodes 11. A wide margin is, however, allowable for such alignment. As will readily be understood, the margin is approximately equal to the width of the photodiodes 11, as indicated at H.

Table 1 shows variations of the photosensitivity to a time of the second heat treatment.

TABLE 1

| Temperature | 170° C. |
|---|---|
| First resin layer thickness $t_1$ | 6 μm |
| Second resin layer thickness $t_2$ | 3 μm |
| Heat Treatment Time (minute) | Normalized Photosensitivity (λ = 550 nm) |
| before formation of the lenses | 1 |
| 0 | 0.9–1.0 |
| 15 | 1.5 |
| 30 | 1.7 |
| 60 | 1.9–2.1 |

Figure 6:
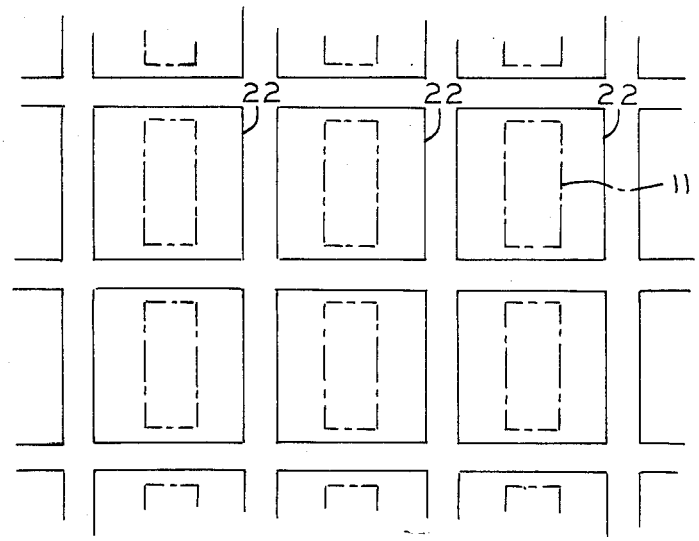
FIG. 6 is a schematic plan view of a solid-state image device according to a second embodiment of this invention.

Referring again to FIG. 4(b) and afresh to FIG. 6, a CCD solid-state image device according to a second embodiment of this invention will be described. As described in conjunction with the FIG. 4(b), the second resin layer 22 is formed on the first resin layer 21. Thereafter the second resin layer 22 is selectively removed by the lithography technique at portions which are laid over the shading layer 19 and the narrow portions 18. Consequently, as depicted in FIG. 6, the second resin layer 22 is patterned like a mosaic in correspondence to the respective photodiodes 11.

Subsequently, remaining parts of the second resin layer 22 are heat-treated in the manner described in conjunction with FIG. 4. As a result, the remaining parts of the second resin layer 22 are transformed into a plurality of spherical optical lenses in correspondence to the respective photodiodes 11.

Figure 7A:
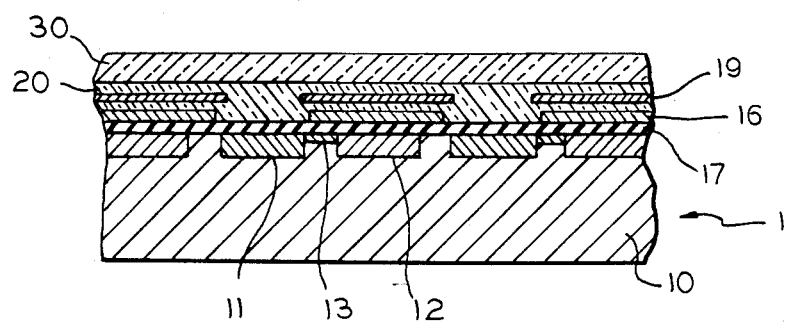
FIGS. 7(a), 7(b), 7(c), 7(d) and 7(e) are diagrammatic vertical sectional views illustrating several steps of manufacturing an interline transfer CCD solid-state color image device according to a third embodiment of this invention.
Figure 7B:
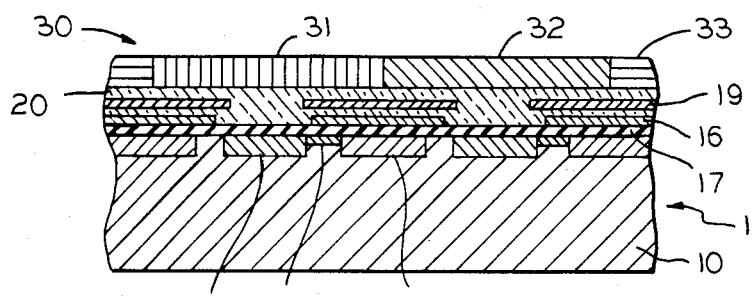

Referring to FIGS. 7(a) through 7(e), a CCD color solid-state image device according to a third embodiment of this invention comprises similar parts designated by like reference numerals. As depicted in FIG. 7(a), a color filter film is formed by a dyeable resin layer 30 on the block surface of the block 1 mentioned in conjunction with FIG. 3. The resin layer 30 may be of a polyvinyl alcohol resin, an acryl resin or the like. In FIG. 7(b), the resin layer 30 is selectively dyed in red, green, and blue over the respective columns of the photodiodes 11. It is possible for this purpose to resort to the photoresist technique. As a result, red, green, and blue stripe-shaped color filters 31, 32, and 33 are formed over each set of three columns of the photodiodes 11.

Figure 7C:
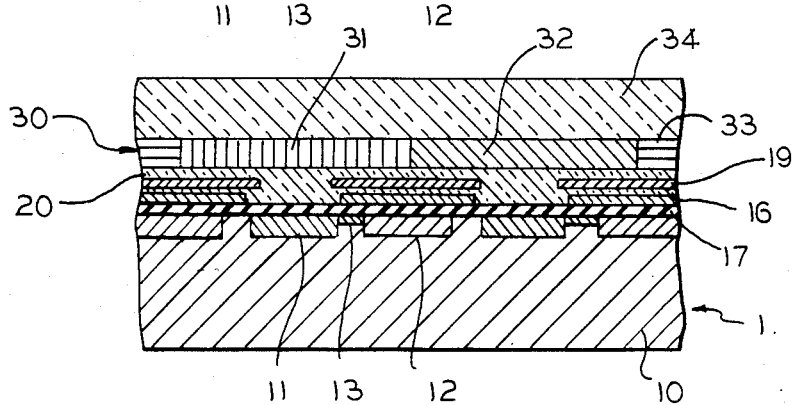

As depicted in FIG. 7(c), a photosensitive transparent resin layer 34 is formed on the resin layer 30. The resin layer 34 may be of a polymethyl metacrylate resin or a polyglycidyl metacrylate resin different from the resin layer 30. The resin layer 34 serves also as a protection layer for the color filters 31 through 33. The resin layer 34 is selectively removed by lithography technique at portions which lie on bonding pad and scribe line areas (not shown) of the block surface of the block. Moreover, the resin layer 34 is subjected to the first heat treatment at a first temperature as mentioned above.

Figure 7D:
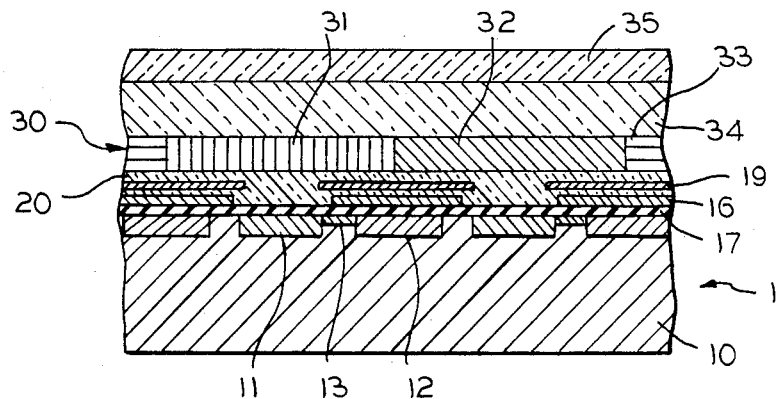

As depicted in FIG. 7(d), a photosensitive transparent resin layer 35 is applied onto the resin layer 34. The resin layer 35 may be of a photosensitive transparent resinous material common to the resin layer 34.

Figure 7E:
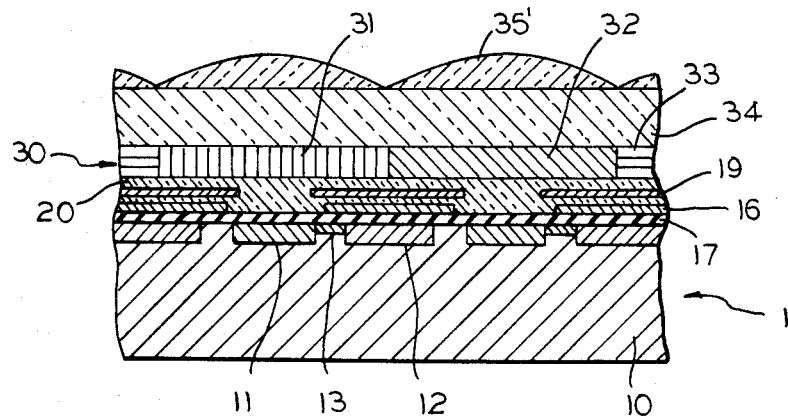

As depicted in FIG. 7(e), cylindrical (or spherical) optical lenses 35' are formed in the manner described in conjunction with FIG. 4.

Thus, the photodiodes 11 receive substantially all rays which are incident towards the block surface. This means that an apparent aperture ratio increases. Accordingly, the high photosensitivity CCD image device can be provided. Thus, all rays incident onto the CCD image device are effectively focused onto the photodiodes 11 even when the respective color filters 31, 32, and 33 are slightly displaced in relation to the photodiodes 11.

While this invention has thus far been described in conjunction with a few embodiments thereof, it will readily be possible for those skilled in the art to put this invention into practice in various other manners. For example, the second resin layer 22 may be formed by a material different from that of the first resin layer 21. In this event, the material of the second resin layer may have a third softening temperature lower than the second temperature and higher than the first softening temperature. Specifically, the second resin layer 22 may be of the phenol novolac resin while the first resin layer 21, a polymer of styrene including 2, 4-dichlorobenzoic acid, manufactured and sold in the name of SEL-N by Somar Industry, Japan. Moreover, this invention is not restricted to the interline transfer CCD solid-state image device, but can be applied to a frame transfer CCD solid-state image device and an MOS type CCD solid-state image device or the like. Each lens may have a triangular or a trapezoidal section. In FIG. 7, the dyeable resin layer 30 may be divided into a plurality of partial areas each of which has a common outline and covers a preselected number of the storage elements arranged in adjacent ones of columns and rows. A prescribed number of the partial areas makes a set and is dyed in the different colors. When the number of the different colors is equal to three or six, the common outline may be hexagonal so as to cover the storage elements without any gaps among the respective partial areas.

What is claimed is:

1. A solid-state image device comprising an image storage block which has a block surface and comprises a plurality of storage elements for storing an image in the form of electric charge, wherein the improvement comprises a first resin layer on and in direct contact with said block surface and an array of optical lenses overlying and in direct contact with said resin layer in correspondence to said storage elements and said optical lenses being formed from a second resin layer.

2. A solid-state image device as claimed in claim 1, wherein said array of optical lenses is for receiving substantially all rays incident towards said block surface as said image.

3. A solid-state image device as claimed in claim 2, wherein said array of optical lenses is of a resinous material.

4. A solid-state image device as claimed in claim 2, wherein said storage elements are arranged in rows and columns, said optical lenses are cylindrical lenses each of which has a partially cylindrical configuration having a cylinder axis aligned along and arranged over the respective columns of said storage elements.

5. A solid-state image device as claimed in claim 4, wherein said cylindrical lenses are continuous on said resin layer with edges of adjacent ones of said cylindrical lenses in contact with each other.

6. A solid-state image device as claimed in claim 2, said storage elements being arranged in rows and columns, wherein said optical lenses are spherical lenses arranged in rows and columns over the respective storage elements.

7. A solid-state image device as claimed in claim 6, wherein said spherical lenses are substantially continuous on said resin layer.

8. A solid-state image device as claimed in claim 3, wherein said first and second resin layer are made of the same resinous material.

9. A solid-state image device as claimed in claim 3, wherein said resin layer is a single layer.

10. A solid-state image device as claimed in claim 3, wherein said resin layer comprises a first film of a dyeable resin on said block surface and a second film of said resinous material on said first film, said first film being dyed in different colors to serve as a color filter.

11. A solid-state image device as claimed in claim 10, said storage elements being arranged in rows and columns, wherein said first film comprises groups of stripes, each group being on a predetermined number of successive columns of said storage elements and being dyed in said different colors.

12. A solid-state image device as claimed in claim 10, said storage elements being arranged in rows and columns, wherein said first film comprises groups of portions of a common outline, each group being on a predetermined number of storage elements in adjacent ones of said rows and columns and being dyed in said different colors.

13. The solid-state image device of claim 1 wherein the array of optical lenses are brought into direct contact with said first resin layer by a lithograph technique and said optical lenses are formed from said second resin layer by photolithograph techniques.

14. A method of manufacturing a solid-state image device comprising an image storage block which has a block surface and comprises a plurality of storage elements for storing an image in the form of electric charge, wherein the improvement comprises the steps of:
   depositing a first resin layer on said block surface to a first predetermined thickness;
   heat-treating said first resin layer at a first temperature into a heat-treated resin layer;
   depositing a second resin layer on said heat-treated resin layer to a second predetermined thickness;
   selectively removing said second resin layer to leave preselected portions corresponding to said storage elements; and
   heat-treating said preselected portions to thermally flow to form an array of optical lenses with said heat-treated resin layer kept intact.

15. A method as claimed in claim 14, further comprising the steps of:
   preliminarily selecting a transparent resinous material having a first softening temperature lower than said first temperature and a second softening temperature higher than said first softening temperature before and after said transparent resinous material is heat-treated at said first temperature, respectively;
   each of said first and said second resin layers being formed by said transparent resinous material;
   said preselected portion heat-treating step comprising the step of:
      causing said preselected portions to thermally flow at a second temperature lower than said second softening temperature.

16. A method as claimed in claim 14, further comprising the steps of:
   preparing a first transparent resinous material having a first softening temperature lower than said first temperature and a second softening temperature higher than said first softening temperature before and after said first transparent resinous material is heat-treated at said first temperature, respectively;
   preparing a second transparent resinous material having a third softening temperature lower than said second softening temperature;
   said first and said second resin layers being formed by said first and said second transparent resinous materials, respectively;
   said preselected portion heat-treating step comprising the steps of:
      causing said preselected portions to thermally flow at a second temperature higher than said third softening temperature and lower than said second softening temperature so as to form said optical lense array.

17. A method of manufacturing a solid-state image device comprising an image storage block which has a block surface and comprises a plurality of storage elements for storing an image in the form of electric charge, wherein the improvement comprises the steps of:
   depositing a first film of dyeable resinous material on said block surface;
   dying said first film in different colors selectively in correspondence to said storage elements to transform said first film to a color filter;
   depositing a second film of a transparent resinous material as a first transparent resin layer on said color filter;
   heat-treating said first transparent resin layer at a first temperature into a heat-treated resin layer;
   depositing a second transparent resin layer on said heat-treated resin layer;
   selectively removing said second transparent resin layer to leave preselected portions corresponding to said storage elements; and
   heat-treating said preselected portions to thermally flow to form an array of optical lenses with said heat-treated resin layer kept intact.

* * * * *